* US005841797A *

United States Patent [19]

Ventrudo et al.

[11] Patent Number: 5,841,797
[45] Date of Patent: Nov. 24, 1998

[54] APPARATUS FOR STABILIZING MULTIPLE LASER SOURCES AND THEIR APPLICATION

[76] Inventors: Brian F. Ventrudo, 2636 Cedar Hill Road, British Columbia, Canada, V8T 3H2; Peter G. Berrang, 1256 St. Dennis, Victoria, British Columbia, Canada, V8S5A7

[21] Appl. No.: 773,016

[22] Filed: Dec. 24, 1996

Related U.S. Application Data

[63] Continuation-in-part of Ser. No. 415,129, Mar. 30, 1995, Pat. No. 5,589,684, which is a continuation-in-part of Ser. No. 267,785, Jun. 28, 1994, Pat. No. 5,485,481.

[51] Int. Cl.$^6$ .................................................. H01S 3/10
[52] U.S. Cl. .............................. 372/6; 372/102; 385/37; 250/225
[58] Field of Search .............................. 372/102.6, 29; 385/37, 10; 250/225; 356/33

[56] References Cited

U.S. PATENT DOCUMENTS

| | | | |
|---|---|---|---|
| 4,635,246 | 1/1987 | Taylor et al. | 370/3 |
| 4,941,726 | 7/1990 | Russell et al. | 372/6 |
| 4,950,882 | 8/1990 | Goutzoulis et al. | 250/214 A |
| 5,015,055 | 5/1991 | Takamatsu et al. | 372/6 |
| 5,187,672 | 2/1993 | Chance et al. | 364/550 |
| 5,258,989 | 11/1993 | Raven | 372/6 |
| 5,271,024 | 12/1993 | Huber | 372/102 |
| 5,276,549 | 1/1994 | Tagawa et al. | 372/6 |
| 5,295,143 | 3/1994 | Rao et al. | 372/22 |
| 5,303,314 | 4/1994 | Duling, III et al. | 372/6 |
| 5,319,528 | 6/1994 | Raven | 362/32 |
| 5,337,382 | 8/1994 | Mizrahi | 372/102 |
| 5,373,526 | 12/1994 | Lam et al. | 372/6 |
| 5,485,481 | 1/1996 | Ventrudo et al. | 372/6 |
| 5,530,709 | 6/1996 | Waarts et al. | 372/6 |

FOREIGN PATENT DOCUMENTS

WO94/13045   6/1994   WIPO .

*Primary Examiner*—Rodney B. Bovernick
*Assistant Examiner*—Yisun Song
*Attorney, Agent, or Firm*—W. Douglas Carothers, Jr.

[57] ABSTRACT

Apparatus for stabilizing multiple laser sources having distinguishable optical characteristics, e.g., in polarization field or operational wavelength, comprises a plurality of semiconductor laser sources having respective lasing cavities capable of lasing within a narrow bandwidth of wavelengths and providing spectral outputs at their respective laser exit facets having different optical characteristics from one another. The spectral output beams of the sources may be coupled to respective optical fibers and the beams combined via a beam combiner, e.g., a polarizing beam combiner or a WDM combiner. The beam combiner combines the beam outputs forming a single beam which is launched into an output optical fiber. At least one feedback fiber grating is provided in at least one of the optical fibers with the number thereof depending upon distinguishable optical characteristics of the multiple laser sources. In the case of distinguishable optical characteristics in the form of polarization field, one grating is required and in the case of distinguishable optical characteristics in the form of operational wavelength, multiple gratings are necessary equal to the number of laser sources. The fiber grating or gratings have a reflectivity band for reflecting back a small portion of selected wavelengths of the single beam which are within the gain bandwidth of the laser sources while the remaining portion of the single beam transmitted through the grating or gratings to a final output. The grating or gratings have a reflectivity level approximately equal to or less than the reflectivity level of the laser source exit facets. The grating or gratings are positioned in the optical fiber or fibers to have an optical separation from the laser sources to cause the laser sources to operate in multiple longitudinal modes broadening the spectral output of the laser sources by several orders of magnitude.

32 Claims, 5 Drawing Sheets

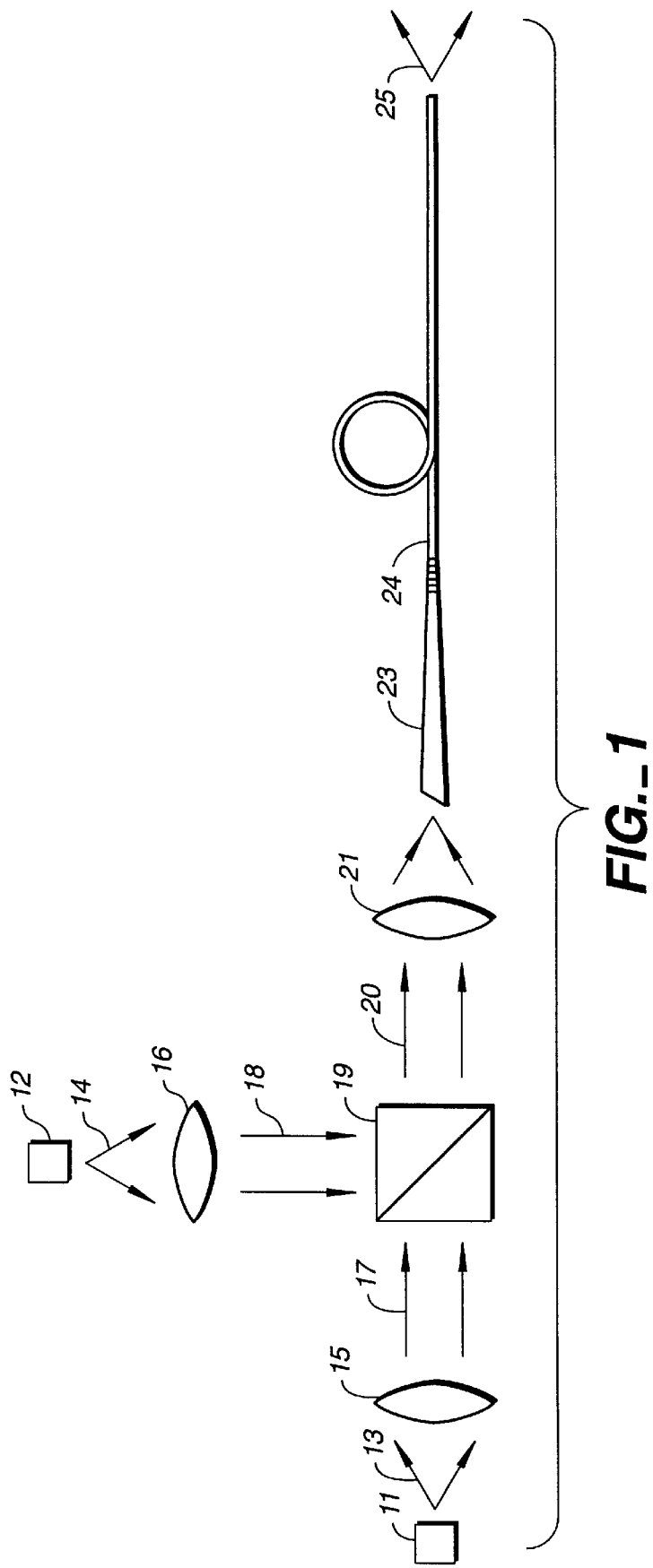
FIG._1

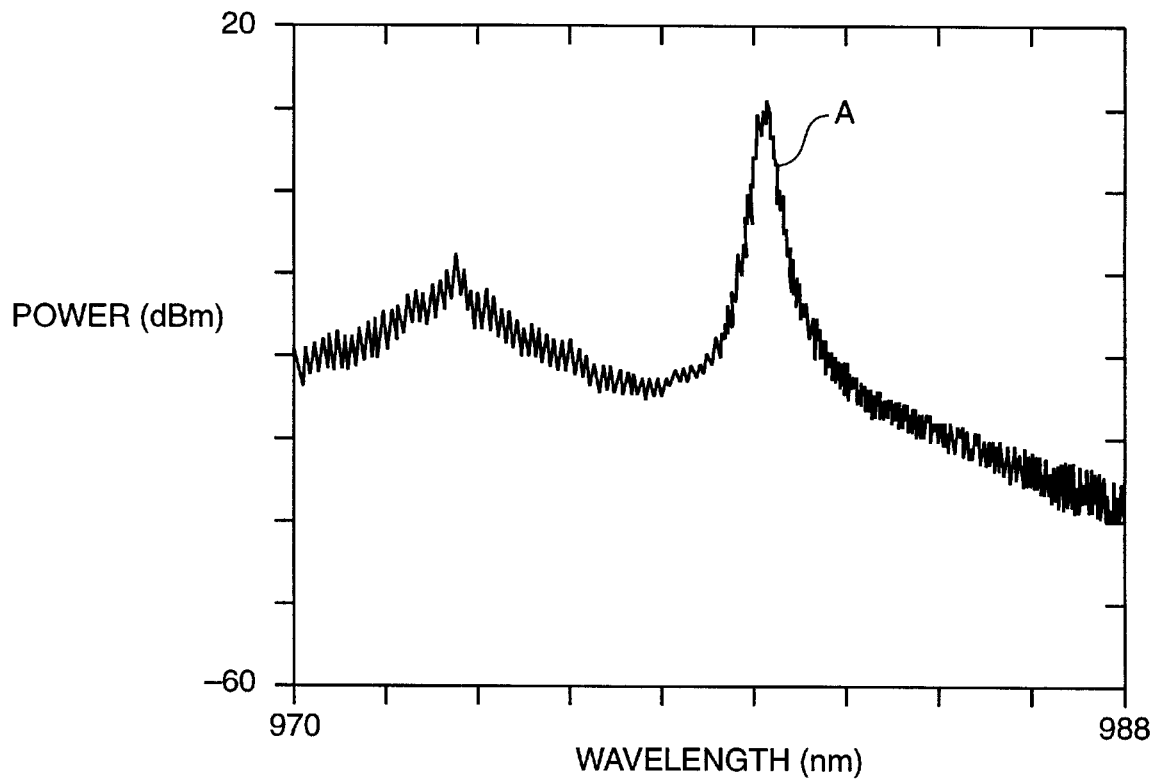
FIG._2A
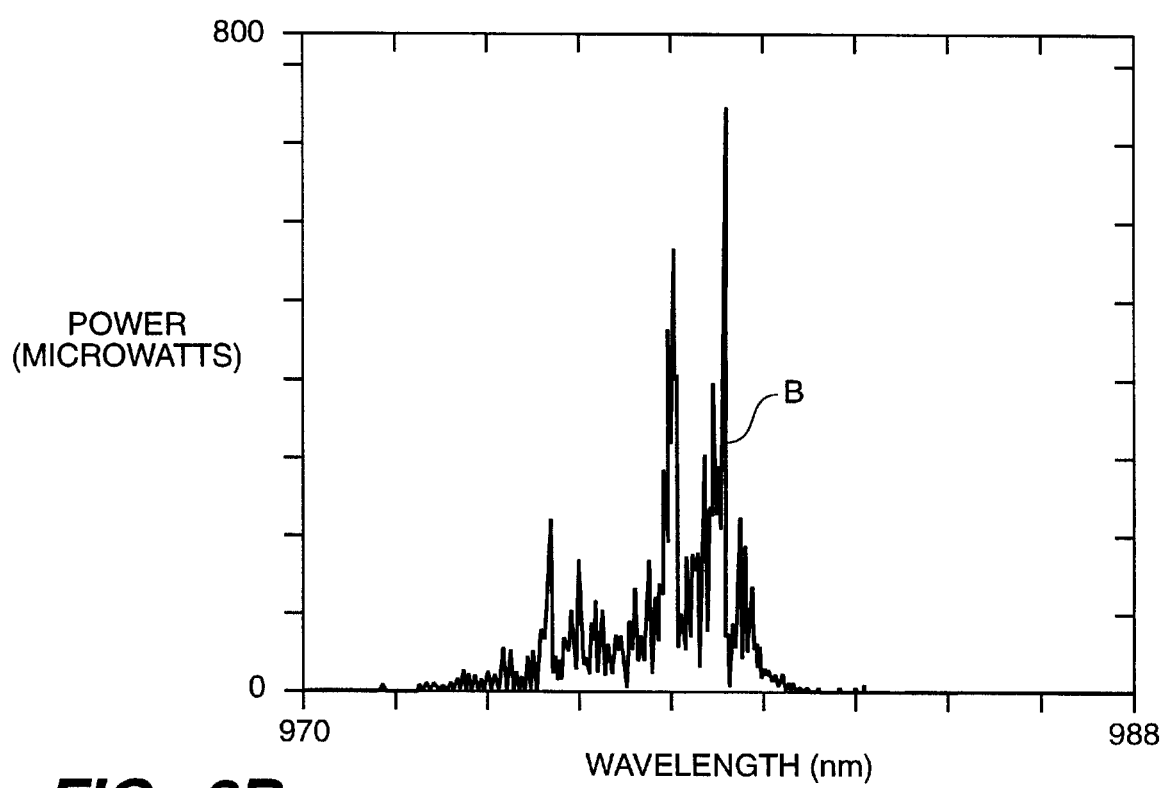
FIG._2B

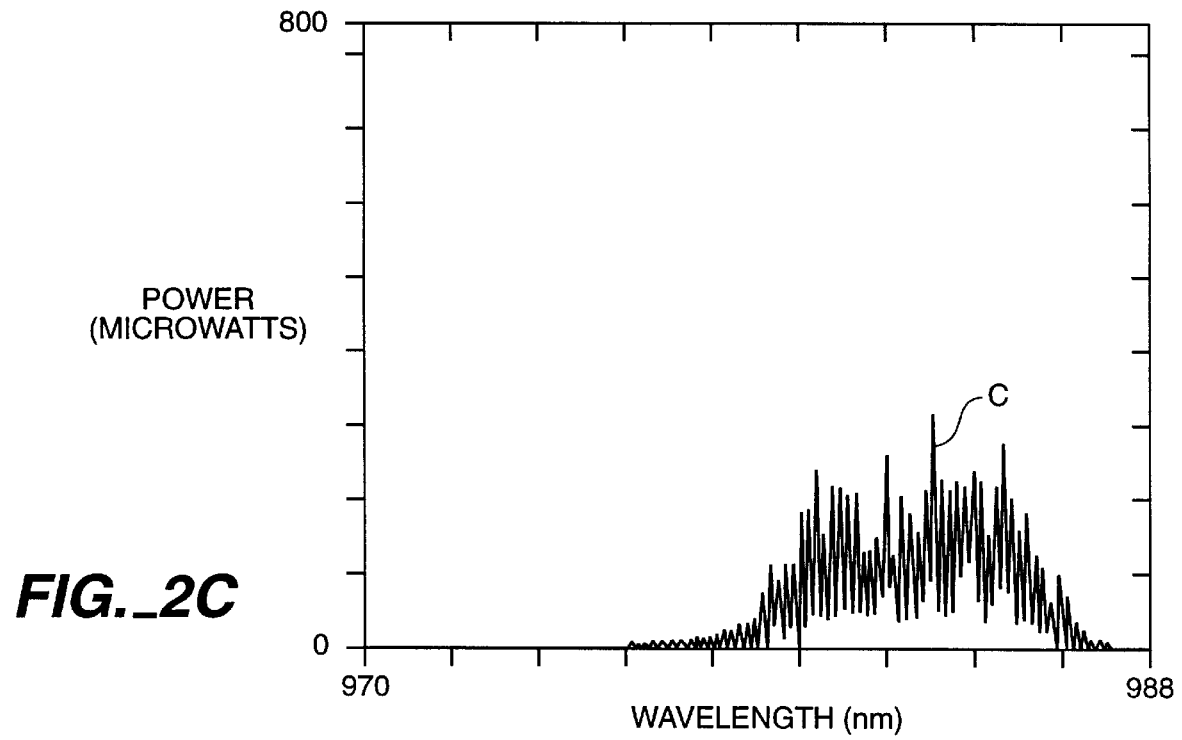
FIG._2C
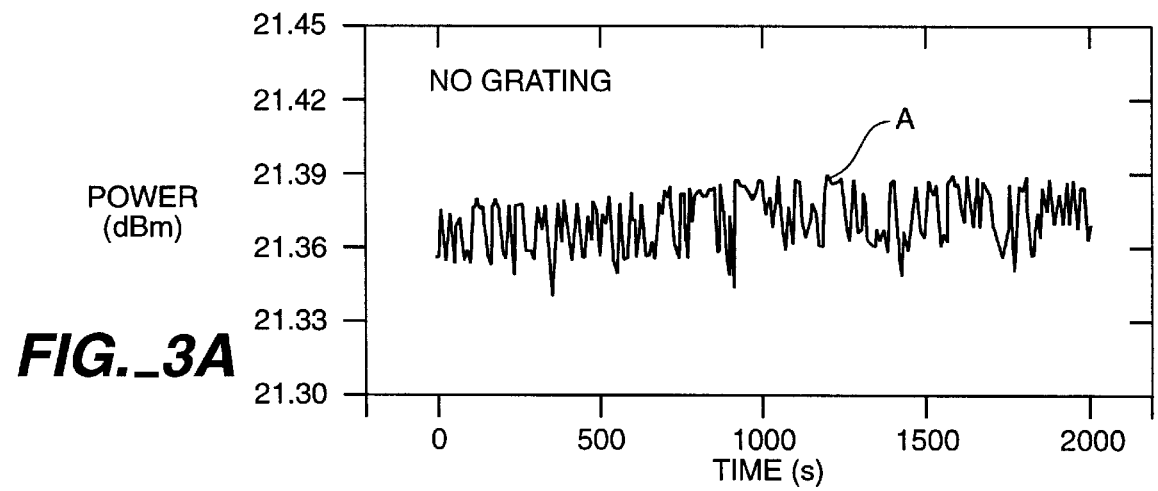
FIG._3A
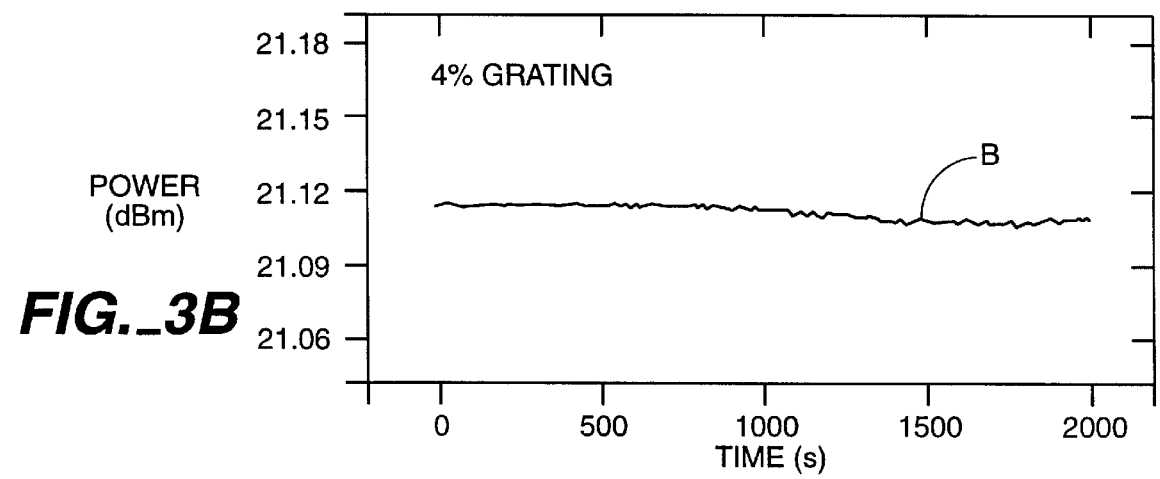
FIG._3B

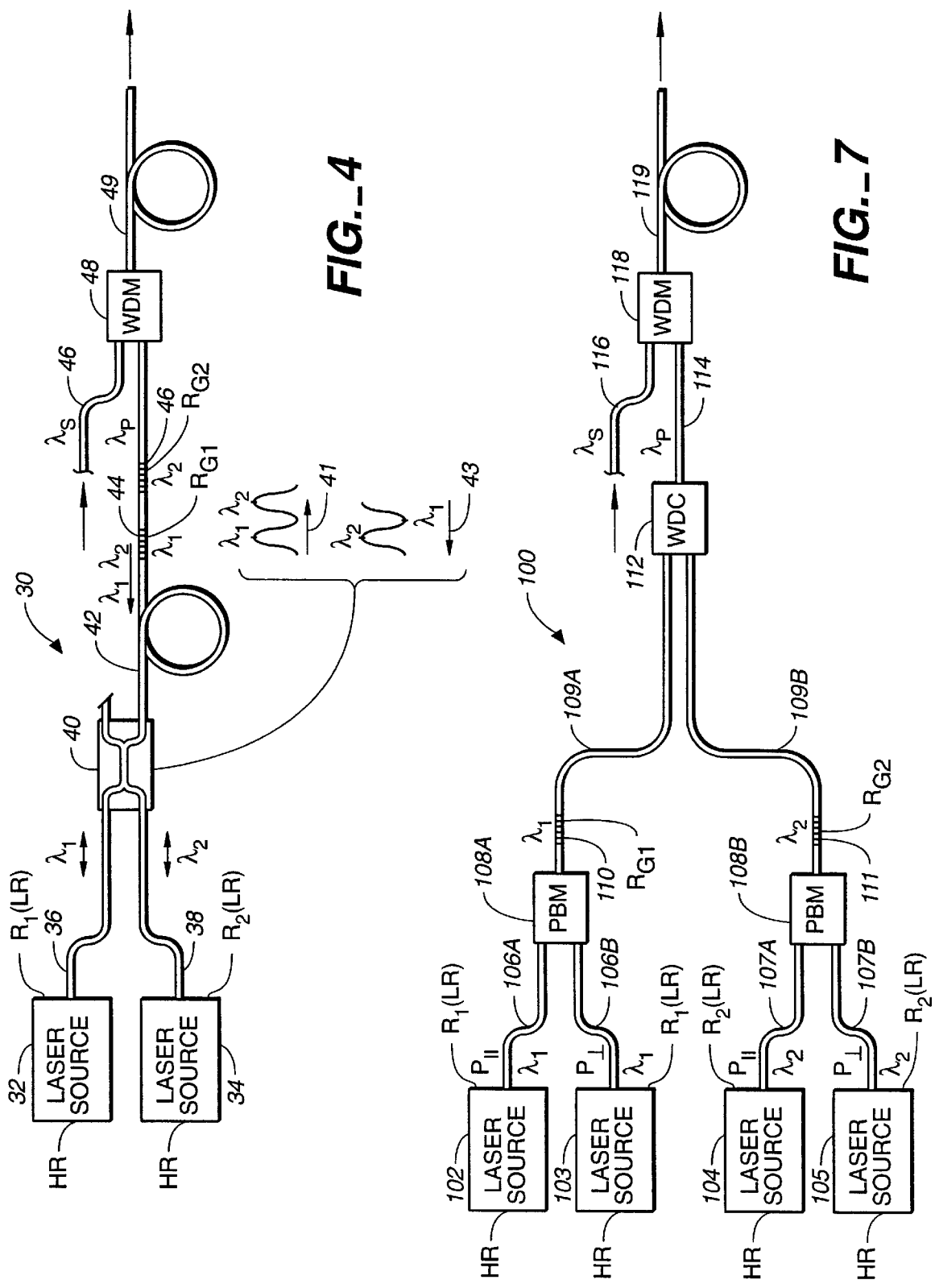

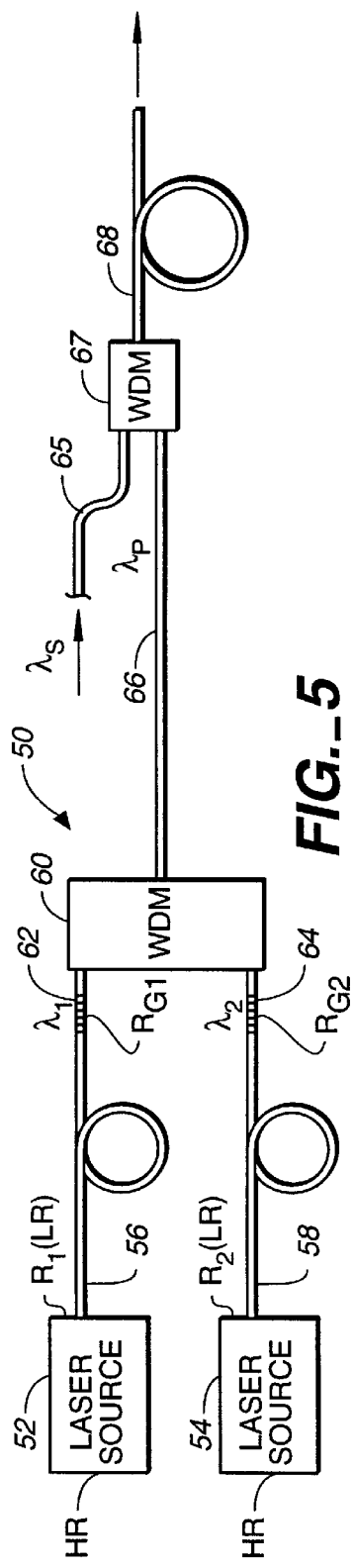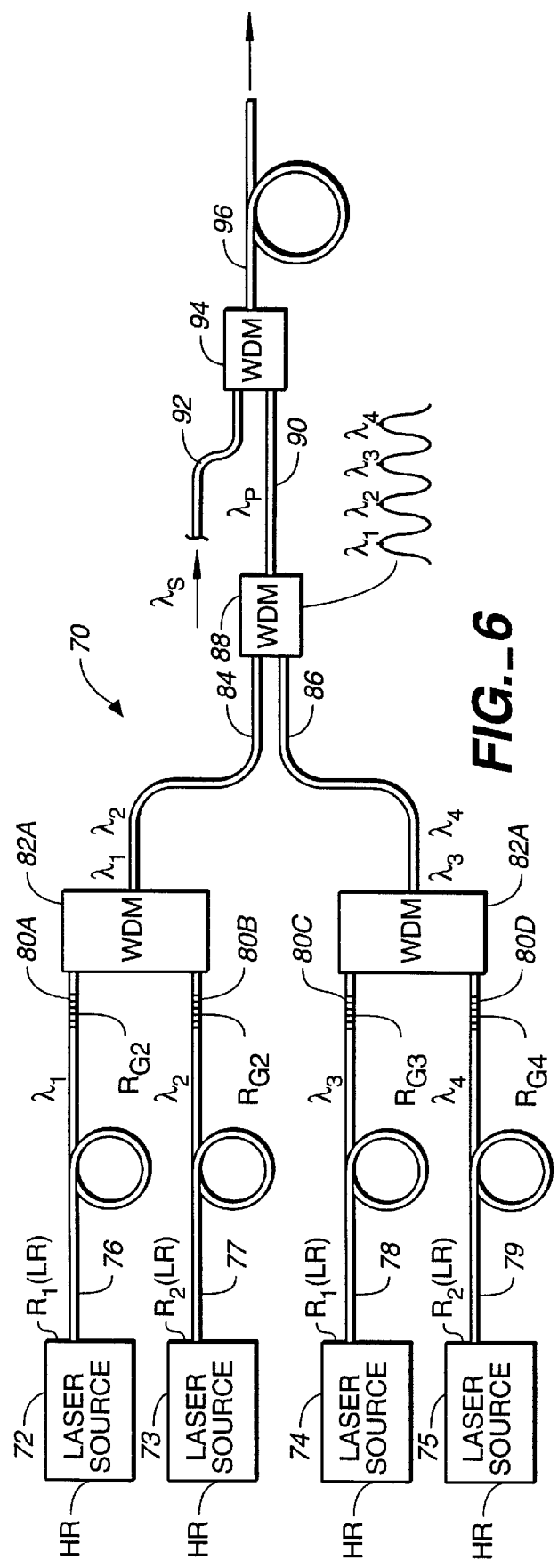

APPARATUS FOR STABILIZING MULTIPLE LASER SOURCES AND THEIR APPLICATION

RELATED APPLICATION

This is a continuation-in-part of U.S. patent application Ser. No. 08/415,129, filed Mar. 30, 1995, which is a continuation-in-part of U.S. patent application, Ser. No. 08/267,785, filed Jun. 28, 1994, now U.S. Pat. No. 5,485,481, which to the extent not included herein, is incorporated by reference.

FIELD OF THE INVENTION

The present invention relates to multiple laser sources with spectral output beams having distinguishable optical characteristics which provide combined high power optical radiation with stabilized wavelength and intensity that is suitable for optically pumping fiber amplifiers or fiber lasers.

BACKGROUND OF THE INVENTION

Optical fiber amplifiers and lasers have rapidly become important components of optical communications systems. Optical fiber amplifiers are used to intensify optical signals that are attenuated along an optical fiber communication path. They have replaced cumbersome electrical repeaters in fiber-optic communication links allowing true all-fiber optical communication systems to be realized. Similarly, optical fiber lasers have been proposed to generate an optical carrier for fiber-optical communications systems. These lasers can be externally modulated to carry digital or analog information and, in some cases, are an alternative to laser diodes as sources of high-power light in optical fiber communication systems.

Both fiber lasers and amplifiers operate on similar principles. The silica glass in the guided-wave region of the optical fiber is doped with traces of a rare-earth element such as erbium or praseodymium, which exist in the triply ionized state in a glass matrix. The energy structure of these ions is such that an optical signal of a particular wavelength propagating in the guided-mode region of the fiber can be amplified if the ions are pumped into an excited energy level by the addition of, for example, electromagnetic radiation of the appropriate energy. In the case of erbium, for example, pumping the ions with light of wavelength 980 nm or 1480 nm will configure the erbium ions to amplify signal light within a wavelength range of approximately 1535 nm to 1565 nm. In the case of praseodymium, pumping the ions with light of wavelength 1017 nm will configure the praseodymium ions to amplify signal light within a wavelength range approximately 1300 nm to 1320 nm. This is the basis for optical fiber amplifiers. If a further mechanism is established to recirculate this amplified signal in the fiber by placing appropriate reflectors at the ends of the fiber, then laser action can occur if the net gain in the fiber equals the loss within some optical bandwidth. Most modern optical fiber communication systems utilize laser sources at approximately 1300 nm or 1550 nm, so fiber amplifiers that operate at either of these wavelengths are of considerable importance.

The excitation or pumping of rare earth doped optical fibers is currently accomplished most conveniently by light from semiconductor laser diode sources that is directed into the end of the doped fiber by means of focusing system such as one comprised of lenses. Current focusing systems couple between 40% to 90% of the light from such laser diode sources into the fiber; commercially available systems typically having coupling efficiencies of 50% to 60% for laser diodes that emit light in a single spatial mode. The guided mode region of the fiber is circular with a typical radius of 3–7 $\mu$m, which is sufficiently small to achieve high intensity over long interaction lengths with only modest optical powers of 50–100 mW. The light intensity required to allow significant amplification is quite high, typically 0.5–1.0 MW/cm$^2$ for erbium-doped fiber amplifiers and 2.0–5.0 MW/cm$^2$ for praseodymium-doped fiber amplifiers. With a coupling efficiency of 50%, this requires laser diodes with output power of 100–200 mW, and such laser diodes are commercially available. Further improvements in amplifier gain can be obtained by increasing the intensity of the pump light in the guided-mode region of the fiber. This can be achieved by reducing the radius of this region, but this increases the numerical aperture of the fiber which may have the effect of reducing coupling efficiency. Alternatively, increasing the output power of the laser diode will increase the intensity; However, the current state of the art does not yet allow the fabrication of reliable single spatial mode laser diodes with output power greatly exceeding 200 mW that have sufficient operating lifetimes to be suitable for optical fiber communication systems. In the case of praseodymium-doped fiber amplifiers, which require even more optical pumping power than erbium-doped fiber amplifiers, it is often essential in some amplifier configurations to couple power from more than one laser diode into the doped fiber. Consequently, combining the power from more than one laser diode is an attractive alternative for increasing the intensity of the optical pump power in dope fiber lasers and amplifiers.

It is known that means exist for combining and scaling the power from two optical sources with orthogonal polarizations or with different wavelengths. Devices fabricated with birefringent materials, such as a Wollaston prism, have been employed to physically separate an unpolarized or partially polarized light beam into separate beams of orthogonal polarization that propagate in different directions. Ideally, the sum of the optical power of the separated beams equals that of the incident beam provided there is no absorption of light in the beam splitting device. In its reverse configuration, however, such a device can be used to combine light from two polarized optical sources into a single beam of unpolarized light, thus combining the optical power. Devices that can perform such a function are numerous and are known to those skilled in the art. Such devices include those based on birefringent crystals, on dielectric coatings deposited on the interface between two glass prisms, and fiber optical devices that combine the light in two polarization-preserving fibers into a single fiber. In the case of different wavelengths, WDM multiplexors have been employed to combine and scale the power of two optical sources to provide a higher output on a single fiber. Such WDM devices may be comprised of dichoric mirrors, conical fused couplers or proximity couplers.

The characteristics of a rare earth doped fiber amplifier or laser is highly dependent on the characteristics of the pump laser. In particular, unwanted fluctuations or instabilities in the optical power or wavelength of the laser diode can cause corresponding fluctuations in the amplification of the signal in an amplifier or in the output power of a laser. Because the response time of the excited state of rare earth elements in glass is approximately $3 \times 10^{-3}$ s to $10^{-2}$ s, pump laser instabilities on a shorter time scale are not manifested in the amplifier or laser operation. The most troublesome source of pump laser diode instabilities on this time scale is noise in the form of laser longitudinal mode hopping and wavelength and intensity fluctuations caused by unwanted optical feedback into the laser diode or changes in temperature or injection current. This noise is especially detrimental in rare earth doped fiber amplifiers because it increases errors in the amplified communication signal and detracts from the practicality of these devices.

Several techniques exist to reduce the effect of pump laser diode noise. One example is an active electrical system that detects the variation in output power of the fiber amplifier caused by a fluctuation in the laser diode characteristics and this signal is fed back into the pump laser at the correct phases to reduce the laser fluctuation. Unfortunately, this technique adds cost and complexity to the amplifier. For this reason, it is preferable to employ a passive method of reducing laser diode fluctuations. An attractive solution is to feed back into the pump laser diode a fraction of its own light. These laser diodes are very sensitive to optical feedback, and if such feedback is properly controlled, improved laser operation can result. Feedback is usually provided by an external reflector such as a mirror or diffraction grating, and external optical elements, such as lenses, are required to manipulate and guide the light out of and back into the laser diode cavity. Although the external optics and reflectors can often be quite compact, it is difficult and expensive to align such a system, and the mechanical and thermal stability can often be inadequate for use in fiber amplifiers and lasers.

It should now be appreciated that a method to couple more optical pump power into rare earth doped fiber amplifiers from semiconductor laser diodes is desirable. It is also necessary to provide a simple, convenient and mechanically rugged means for reducing the wavelength and intensity instabilities for the pump laser diodes.

SUMMARY OF THE INVENTION

The present invention relates generally to multiple laser sources having spectral output beams having distinguishable optical characteristics which provide combined high power optical radiation with stabilized intensity output highly suitable for optically pumping fiber amplifiers or fiber lasers. According to a principal aspect of this invention, apparatus for stabilizing multiple laser sources having distinguishable optical characteristics, e.g., polarization fields or operational wavelengths, comprises a plurality of semiconductor laser diode sources having respective lasing cavities capable of lasing within a narrow bandwidth of wavelengths and providing spectral outputs at their respective laser exit facets having different optical characteristics from one another. The spectral output beams of the sources may be combined via a beam combiner or a multiplexor/demultiplexor depending upon the distinguishing beam optical characteristic. The beam combiner combines the beam outputs forming a single beam which is launched into an output optical fiber. One or more Bragg gratings are provided in the output optical fiber, depending upon the distinguishing beam optical characteristic, controlling the wavelength of the laser sources. In the case of distinguishing beam optical characteristics of different polarization fields, a single grating is utilized in the output fiber from the beam combiner. In the case of distinguishing beam optical characteristics of different operational wavelengths, multiple fiber gratings, one for each laser sources are placed in the output fiber from the beam combiner or may be respectively placed in exit facet fibers coupling the respective laser source outputs to the beam combiner. The fiber grating or gratings have a reflectivity band for reflecting back into the laser cavities a small portion of selected wavelengths within the bandwidth of the fiber grating and which are within the gain bandwidth of the laser sources. The remaining portion of the single beam is transmitted through the grating or gratings to a final output for an applied application, such as pumping a fiber amplifier of fiber laser. The grating or gratings have a reflectivity level approximately equal to or less than the reflectivity level of the laser source facets. The grating or gratings are positioned in the optical fiber to have an optical separation from the laser sources to operate in multiple longitudinal mode operation broadening the spectral output of the laser sources by several orders of magnitude substantially eliminating noise due to longitudinal mode transition in the laser sources from one mode to another mode or due to extraneous feedback from the pump optical components or from an applied optical application. As previously indicated, the distinguishable optical characteristics between or among the laser sources may be either their polarization fields or their operational wavelengths or a combination thereof.

Thus, the present invention comprises multiple laser sources having different optical characteristics, e.g., polarization fields or operational wavelengths, that are combined, using either a polarizing beam combiner or a WDM combiner. The output light of at least two semiconductor laser diodes respectively emit either linearly polarized electric fields of substantially similar wavelength or emit beams of different wavelengths. The optical power of the combine light is ideally a sum of the optical power emitted from each optical source providing a scaled power output. The combined light from the two lasers is directed into an optical fiber which contains a fiber Bragg grating that serves to reflect a fraction of the output power back into the cavity of the laser diodes. A fiber Bragg grating is a periodic structure of the refractive index variations in or near the guided-mode region of the optical fiber that can reflect light of a predetermined narrow bandwidth propagating along the fiber. The reflected light propagates in the guided-mode region of the optical fiber in a direction opposite to that of that of the incident light. The effect of the reflected light on the laser diodes depends on the magnitude of the fiber Bragg grating reflectivity, the optical bandwidth of the reflectivity, the wavelength of the fiber Bragg grating resonance compared to the wavelength of the maximum gain of the laser, the magnitude for the laser diode injection current. For the appropriate laser diode and fiber Bragg grating parameters, a single fiber Bragg grating can stabilize the wavelength and intensity of multiple laser sources.

The apparatus, therefore, according to one aspect of the present invention comprises at least two semiconductor laser diodes, a means for delivering collimated polarized light from the laser diodes to a polarizing beam combiner which combines the optical power into a single beam of light and delivering the combined light into a length of optical fiber, and fiber Bragg grating formed in or near the guided wave region of the optical fiber.

In one of its aspects, the invention consists of an apparatus for generating light beams from a dual laser source having a narrow optical bandwidth and stabilized wavelength and intensity. The apparatus comprises means to deliver collimated, linearly orthogonally polarized, single spatial mode optical radiation from two semiconductor laser diodes of similar wavelength into a polarizing beam combiner device which combines the radiation into a single collimated beam. The beam is directed into optical fiber that is capable of guiding at least one mode of the laser diodes in a region of the fiber. A narrow bandwidth reflector is formed in the guided mode region of the optical fiber, and the light reflected from the grating acts to stabilize both laser diodes simultaneously.

In another of its aspects, the invention comprises an apparatus for generating a stable source of optical radiation comprising at least two mutually incoherent laser diodes that emit linearly polarized light substantially in a single spatial mode and that include a laser diode cavity including an output facet having substantially broadband reflectivity capable of generating multiple longitudinal modes within the laser cavity in the absence of external optical feedback at substantially low threshold. Means are provided for presenting the emission of the laser diodes such that the polarization of the laser diodes are orthogonal to each other. A polarizing beam combiner is used to combine two beams of light of substantially orthogonal polarizations into a single, substantially unpolarized beam of light, while summing the optical power of the mutually incoherent light beam. Means are provided for directing the orthogonally polarized emission of each laser diode into the polarizing beam combiner while maintaining the polarization state of each laser diode such that the light beams from each laser exiting the beam combiner are substantially overlapped and co-propagating. An optical fiber is provided which include a guided-wave region that is capable of sustaining at least one mode of wavelength of the laser diode. Means are provided for directing the combine light of the laser diodes into the guided-mode region of the optical fiber, and narrow-bandwidth reflector is formed in the guided mode region of the optical fiber.

The apparatus, according to another aspect of the present invention comprises at least two semiconductor laser diodes, means for delivering light of different peak wavelengths from the laser diodes to a WDM combiner which combines the optical power into a single beam of light and delivering the combined light into a length of optical fiber having multiple fiber gratings equal to the number of laser sources formed in or near the guided wave region of the optical fiber. The gratings each function as narrow bandwidth reflectors and the light reflected from the gratings functions to stabilize the operation of the laser diodes into multiple longitudinal mode operation.

The multiple gratings provide a reflectivity large enough to be within gain bandwidth of all the laser sources. The reflectivity level of the gratings does not exceed the reflectivity level of the respective laser exit facets but exceeds the reflectivity level of any spurious or extraneous reflectivity feedback in the pump system such as from different optical components in the system or from the applied optical application, such as in the case of pumping an optical fiber amplifier. The gratings are positioned in the optical fiber to have an optical separation from the laser sources to operate in multiple longitudinal mode operation broadening the spectral output of the laser sources by several orders of magnitude so as to mitigate the effects of longitudinal mode hopping present where the narrow band output spectrum of the laser sources is sufficiently broad to permit mode hopping in the absence of employing the gratings. The increase in multiple longitudinal modes substantially eliminates any favoritism for dominate or predominate mode oscillation because of the coherence collapse nature of the scaled output beam.

This scaled beam has excellent utility for pumping optical fiber amplifiers such as single mode fiber amplifiers, or multimode or double clad fiber amplifiers with a doped rare earth core, e.g., an Er core doped, single mode fiber amplifier, or a Yb core doped double clad amplifier pumped via its inner pump cladding.

In another aspect of the present invention, the fiber gratings may be positioned in respective optical fibers coupling the respective laser source output beams from the laser source exit facets to the WDM combiner rather than in the output fiber from the WDM combiner. In this case, the respective optical gratings have an optical separation from their respective laser sources to operate in multiple longitudinal mode operation broadening the spectral output of the multiple laser sources operating at different peak wavelengths by several orders of magnitude, so that noise in the form of longitudinal mode hopping in operation of the multiple laser sources is mitigated providing continuously uniform intensity, scaled power to an applied optical application, such as pumping a fiber amplifier or fiber laser.

The optical separation required between the laser source exit facets and the fiber gratings may also be defined relative to the laser source coherence length. Generally, the separation should be approximately the same as or greater than the coherence length of the laser, but whatever the properties of the laser sources and their coupling efficiency with the optical fiber and the WDM combiner, the distance is that which is sufficient to induce coherence collapse.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic representation of a stabilized multiple laser source according to this invention.

FIGS. 2A and 2B are graphs comparing the output spectrum of two laser diodes with and without a fiber Bragg gratings in the optical fiber into which the optical radiation from both laser diodes is focused.

FIG. 2A is the spectrum of two laser diodes of slightly different center wavelengths that are stabilized by fiber grating according to the invention.

FIGS. 2B and 2C are the spectra of the two laser diodes operating without optical feedback from a fiber grating.

FIGS. 3A and 3B are graphs comparing the time dependence of the intensity of two laser diodes with and without a fiber Bragg grating in the optical fiber into which the optical radiation from both laser diodes are focused.

FIG. 4 is a schematic representation of another stabilized multiple source according to this invention.

FIG. 5 is a schematic representation of a further stabilized multiple laser source according to this invention.

FIG. 6 is a schematic representation of a modified form the invention as illustrated in FIG. 5.

FIG. 7 is a schematic representation of an even further stabilized multiple laser source according to this invention.

DETAILED DESCRIPTION OF THE PREFERRED EMBODIMENT

FIG. 1 illustrates the stabilized dual laser source in accordance with the preferred embodiment of the invention. Two laser diode 11 and 12 emit diverging optical radiation in a single spatial mode. The lasers are typically fabricated with a quantum-well epitaxial structure or index guided structure from Group III–V semiconductor regimes such as AlGaAs, InGaAs or InP, and are typically pumped by current injection. The lasers are configured with appropriate dielectric coatings to emit radiation primarily from the front facet exit. Semiconductor laser diodes with the necessary characteristics are commercially available.

The divergent emission 13 and 14 from each laser is collimated with delivery system 15 and 16. In the preferred embodiment, this system consists of lens with the appropriate characteristics to collimate the laser output. However, the delivery system could also be a lens that directs a substantial fraction of the light into polarization preserving fiber such as Panda™ fiber from Fujikura Ltd., followed by a lens to collimate the output of the fiber. Alternatively, the first lens in the latter embodiment could be replaced by placing the optical fiber in proximity to the laser diode so as to collect a significant fraction of the laser diode output. In all cases, it is essential for the polarization of the electric field of the output 17 and 18 of each laser diode to be mutually orthogonal upon incidence into the polarizing beamsplitter or beam combiner apparatus 19. The elements of FIG. 1 were mounted on an optical table. Mechanical positioners were used for each of the laser diodes, the collimating lenses, the focusing lenses and the optical fiber. The position of the beam combiner 19 is fixed in the optical path while the positions of the other elements are adjusted using the positioners to achieve the required orthogonality.

In the preferred embodiment of the invention, the beam combiner apparatus 19 consists of two right angle dielectric prisms epoxied together hypotenuse-to-hypotenuse. Dielectric coatings such as $HfO_2$ or $TiO_2$, are deposited on the prism hypotenuse surfaces prior to the epoxy operation. The coatings are such that light of one polarization, such as at 17, is completely transmitted through the cube, as shown in FIG. 1, while light of an orthogonal polarization at 18 is nearly completely specularly reflected. If the angles of the cube are 45°, as shown, and if the incident light 17 and 18 propagate in the same plane and in a direction that is mutually orthogonal, then the two beams exiting the beam combiner will be collinear. The optical power of the two beams will be summed linearly such that if the power of the laser 11 is $P_1$ and the power of the laser 12 is $P_2$, then the power in beam 20 exiting the beamsplitter will be $P_1+P_2$, provided there is no absorption or scattering of light in the optical path.

Although the preferred embodiment includes a dielectric beam combiner as described, those skilled in the art will appreciate that there are a variety of optical devices that act to combine light of two orthogonal polarizations into one beam with the effect of summing the beams and, therefore, scaling the power. Beam combiner devices can be fabricated in polarization-maintaining optical fiber and have the same effect as the bulk-optic combiner described above. Essentially, the device is composed of two polarization-maintaining fibers in which polarized light from a laser propagates. A section of each fiber is polished down to within a few microns of the light-guiding region and these regions are brought into proximity to each other. In this circumstance, it is possible for the light from each fiber to couple into the other fiber and back again along the length of the interacting region. The length of this region can be chosen so that all the light is in one fiber, effectively combining the light (and power) from two fibers into one. These devices are known and are commercially available, such as, for example, the PB-100 series device from JDS Fitel. The use of such devices is included in the scope of the present invention.

The collimated beams 20 exiting the beam combiner are collected with a focusing system 21 and directed in a length of optical fiber 23 containing a fiber Bragg grating 24 which is 70 cm from the input of the fiber in the preferred embodiment. The optical fiber is typically fabricated from silica glass containing trace dopants to improve the light guiding characteristics of the fiber. Such dopants include germanium, phosphorus, and aluminum. The fiber refractive indices and core size are such that the light from the laser diodes can be guided along a region of the fiber with minimal loss. The preferred embodiment of the invention incorporates optical fiber that sustains only the lowest order guided mode; this requires the fiber to have a V-number of less than approximately 2.405, where V is defined by $$V = \frac{2\pi a}{\lambda} \sqrt{n_1^2 - n_2^2}$$

where a is the radius of the core, $\lambda$ is the wavelength of the light, $n_1$ is the refractive index of the core and $n_2$ is the refractive index of the cladding.

The fiber 23 can be fabricated to have a small birefringence and hence to not strongly maintain the state of polarization of the light in the fiber. The polarization states will thus be altered by imperfections in the glass or by birefringence that is induces by bending stress. This may in some circumstances cause an uncontrolled amount of feedback from the fiber Bragg grating into each of the two laser diodes, since the feedback must traverse the polarizing beamsplitter on its return into the laser diode cavities. As a result, the preferred embodiment of the invention uses fiber with a constant longitudinal birefringence induced upon fabrication that maintains the state of polarization of light that is launched into the fiber such as Panda™ fiber from Fujikura Ltd.

The fiber Bragg grating 24 acts to reflect a portion of the light from each laser diode back into each respective laser cavity provided the wavelength of maximum reflection from the grating is within the gain bandwidth of the laser diodes. The remainder of the light 25 passes through the grating end exits the fiber as output. The grating can be etched near the guided-mode region of the fiber using lithography techniques, or more conveniently, can be created by exposing the guided-mode region to a pattern of periodic intensity variation of high-fluence ultraviolet light incident upon the fiber from the die. If the later techniques is used, it is convenient if the guided-mode region of the fiber contains a concentration of germanium to render the fiber photosensitive to the incident ultraviolet light.

In the preferred embodiment of the invention, the fiber grating is selected to have a maximum reflectivity within 10 nm of the free-running laser diode emission wavelength, and the reflectivity of the grating is similar to that of the exit facet of the laser diode but preferably less. The full-width-at-half maximum bandwidth of the grating reflectivity is typically 0.05 nm to 2.0 nm. The optical grating 24 is preferably separated from the exit facets of the laser sources by a distance approximately equal to or greater than the coherence length of the laser sources which may be a few hundred micrometers to several meters but is roughly around one meter or so.

The effect of the fiber grating on the spectral characteristics of the laser diode is explained by considering the wavelength-dependent loss in the coupled cavity formed by the fiber grating and the laser diode facet. Those skilled in the art will appreciate that the optical feedback from the fiber grating effectively reduces the loss of light from the laser cavity of light within the bandwidth of the fiber grating. The laser will operate at the wavelength of lowest loss, hence the wavelength of the laser diode can be shifted from its free-running value to that of the fiber grating. This effect occurs to an extent that varies with the wavelength separation between the fiber grating and the gain peak of the laser diode as well as on the magnitude of the reflectivity of the fiber grating. The effective reflectivity $R_{\mathit{eff}}$ of the fiber grating is given by $R_{\mathit{eff}} = \eta^2 R_g$ where $\eta$ is the coupling efficiency of the laser diode to the fiber and $R_g$ is the reflectivity of the fiber grating.

The spectrum of the laser diodes under conditions of optical feedback from the fiber grating is affected by the feedback of the laser diode cavity itself, which is formed by the cleaved ends of the semiconductor chip. In the preferred embodiment of the invention, the reflectivity of the fiber grating is selected such that the broad band feedback from the laser diode facet is greater than or approximately equal to the feedback from the fiber grating. In this case, the feedback from the fiber grating acts as a perturbation of the coherent electric field formed in the laser cavity. The perturbation breaks the coherence of the laser diode emission thus broadening the spectral output of the laser diode by several orders of magnitude and resulting in the excitation of several external cavity modes of the coupled cavity system. This is termed coherence collapse of the laser diodes. These modes oscillate at frequencies that are multiples of the round-trip frequency of the coupled cavity but lie within the bandwidth of the fiber grating. The laser diode is thus constrained to operate within the fiber grating bandwidth and large fluctuations in the wavelength and intensity of the laser diode are avoided.

In a free-running laser diode, lower frequency (<1 MHz) intensity fluctuations are caused by the transition between longitudinal modes of the laser diode cavity. Such transitions are caused by extraneous optical feedback or current temperature fluctuations of the laser. The noise cause by these transitions is detrimental to the operation of fiber lasers and amplifiers; it is greatest when there is a transition between one single longitudinal mode and another single longitudinal mode. Since the presence of the fiber grating induces the simultaneous lasing of multiple (external-cavity) longitudinal modes, the noise cause by such mode transitions is correspondingly reduced or mitigated.

The lasers are not perturbed by extraneous optical feedback from reflective components located beyond the fiber grating provided the magnitude of the extraneous feedback is below that provided by the fiber grating.

As previously indicated, multiple longitudinal mode operation described above requires that the optical separation between the laser diodes and the fiber grating is preferably longer than that of the coherence length of the laser diodes. If the separation is less than the coherence length, the feedback will be coherent with the output of the laser diodes and very narrow, single longitudinal mode operation near the fiber grating wavelength will result; such a situation may again lead to intensity noise if mode transitions occur.

In the preferred embodiment of the invention, the two strained-layer InGaAs multi-quantum well semiconductor laser diodes 11 and 12 are SDL-6500 lasers from SDL, Inc. of San Jose, Calif., and the beams emitted from the lasers are collimated with aspheric lens systems 15 and 16, namely the Corning Precision Molded Optics 350150. Each laser typically emits optical radiation at 960–1160 nm. The lasers emit linearly polarized light and are mechanically oriented by positioners so that the light from the lasers entering the beamsplitter is mutually orthogonally polarized. The lasers and lenses are aligned in such a way that the collimate light from each laser passes through the polarizing beam combiner 19 and exits the device co-linearly so as to overlap and be co-propagating at beam position 20. In this way, light beam 20 exiting the beamsplitter has optical power that is a sum of two individual light beams. The combined beam is collected and focused with an aspheric lens 21 (Corning Precision Molded Optics model 350170) into an optical fiber 23 containing a fiber Bragg grating 24 with an efficiency of at least 0.5. The reflectivity of the grating under these conditions should be 0.02 to 0.06 to ensure that both lasers are stabilized at the grating wavelength while allowing the majority of the laser light to pass beyond the grating into the remaining portion of the optical fiber. The optimum grating reflectivity is dictated by the coupling efficiency. The wavelength of each laser need not be identical but should typically lie with 10 nm of the wavelength of the maximum reflectivity of the fiber grating. The grating is typically 1 to 2 mm in length and may have a bandwidth of 0.2 nm to 0.5 nm. However, the bandwidth can be greater up to about 2 nm extending the magnitude of the number of possible longitudinal modes of operation of the laser diode sources as set forth, in U.S. Pat. No. 5,485,481. To ensure that a state of coherence collapse is maintained in the two lasers, it is desirable to maintain an optical separation between the fiber grating and the lasers of at least one-half meter.

Assuming the fiber is lossless, and assuming the laser sources are substantially mutually incoherent, the output power $P_{out}$ from the end of the fiber is given by $P_{out} = (\eta_1 P_1 + \eta_1 P_2)(1 - R_g)$ where $P_1$ and $P_2$ are the output powers from the facets of each of the two lasers, $\eta_1$ and $\eta_2$ are the coupling efficiencies of each lasers through the lenses and beam combiner and into the fiber containing the grating, and $1 - R_g$ is the transmission of the grating. If lasers of similar power are used and similar coupling efficiencies are obtained, this equation demonstrates that it is possible to obtain twice as much power from the fiber as would be obtained with single laser diode. For example, with commercially available lasers that emit 150 mW and with coupling efficiencies of 0.6 for each laser, 171 mW of stabilized laser light can be obtained through a grating with a reflectivity of 0.05.

FIGS. 2A, 2B and 2C illustrate the optical spectrum of the present invention. Curves B and C of FIGS. 2B and 2C are the spectra of each individual laser diode without stabilization by a fiber Bragg grating. The destabilization of the laser diode is caused by a small mount of broadband optical feedback into the laser cavities. Curve A of FIG. 2A is the spectrum of the combined laser sources stabilized by a fiber grating with a similar amount of broadband feedback into the laser cavities.

FIGS. 3A and 3B illustrate the reduction in intensity fluctuation provided by the present invention. Curve A in FIG. 3A is combined intensity of the laser diodes without stabilization by a fiber Bragg grating. The obvious fluctuations in power are caused by laser mode transitions, as described previously. Curve B in FIG. 3B illustrates the reduction in intensity noise as a result of stabilization of the lasers with a fiber Bragg grating.

Further embodiments of this invention are illustrated in FIGS. 4–7 relating to apparatus for generating a stable source of optical radiation comprising multiple semiconductor laser sources that emit beams of different operational wavelengths substantially in a single spatial mode via respective laser exit facets. The respective beams are coupled via a WDM combiner and launched into an output optical fiber destined for an applied optical application, such as for pumping an fiber amplifier or fiber laser. Optical fiber gratings are provided in either the exit facet optical fibers coupling the output from the respective laser sources or in the output fiber from a WDM combiner. The gratings have a reflectivity band that at least overlaps to some extent the gain bandwidth of the laser sources. A small portion of the respective beams from the multiple laser sources is reflected back into their respective laser cavities. The reflectivity level of the respective laser exit facets is designed to be equal to or more preferably exceed the reflectivity level of the fiber grating, generally 3 or more times greater. However, the reflectivity level of the fiber gratings is greater than any extraneous feedback due to noise such as spurious reflections from optical components in the apparatus or from the applied optical applications as well as back scattering from stimulated Raman scattering (SRS) and amplified spontaneous emission (ASE). Moreover, the fiber gratings are positioned in the optical fiber of fibers a distance from the laser sources (from the laser exit facets) a distance approximately equal to or greater than the coherence length of the laser sources so that the laser sources operate in multiple longitudinal modes, broadening the spectral output of the laser sources by several orders of magnitude, which is identified in the art as coherence collapse. The coherence collapse is especially useful in the pumping applications substantially eliminating the effects of noise due to longitudinal mode transition in the semiconductor laser sources from one mode to another mode and also due to extraneous feedback from the pump optical components and the applied optical application.

The embodiments of FIGS. 4 and 5 differ from the embodiment of FIG. 1 in that the laser sources have different distinguishable optical characteristics in their output beams. In the FIG. 1 embodiment, the differences are relative to optical beam polarization fields whereas in FIG. 4 embodiment, the differences are relative to optical beam wavelengths.

Mention has been made above of the fiber gratings having a reflectivity band within or overlapping in some aspect with the gain bandwidth of the laser sources. As is known in the art, the reflectivity bandwidth of fiber gratings are quite small, normally not exceeding 1 nm. On the other hand, in order to wavelength combine two laser output beams of different peak wavelengths, the WDM combiner, such as a fused biconical coupler, a 3 dB coupler or a dichroic mirror, generally require a sufficient wavelength separation, for example, at least a 3 to 4 nm separation in wavelength to achieve efficient wavelength combining. Such a separation, however, generally exceeds the reflectivity bandwidth of the typical fiber grating. Therefore, a separate grating is required for each laser source, whether the gratings are respectively in an exit facet fiber coupling the optical output between each laser source and the WDM combiner or are serially located in the output fiber from the WDM combiner.

Reference is now made to FIG. 4 illustrating a further embodiment of this invention comprising apparatus 30 having multiple laser sources 32 and 34 with distinguishable optical characteristics in the respective output beams in the form of different operational wavelengths so as, when combined, to provide a scaled power output, for example, for high power pumping of a fiber amplifier. From one point of view, apparatus 30 can be viewed as multiples of the apparatus shown in FIG. 2 of incorporated U.S. Pat. No. 5,485,481 in combination with a WDM combiner 40 for combining the multiple spectral output beams from multiple laser sources 32, 34 for pumping a rare earth doped optical amplifier 49.

In particular, semiconductor laser sources 32 and 34 have their output beams coupled respectively to exit facet optical fibers 36 and 38 and the fiber coupled outputs are combined via WDM combiner 40 providing output, $\lambda_P$, on single output fiber 42. Exit facet fibers 36, 38 in this embodiment as well as in subsequent embodiments, are efficiently coupled to receive the output beams from laser sources 32, 34 through an appropriate lens system or direct fiber coupling as are all well documented in the art. Sources 32 and 34 have rear facets of high reflectivity (HR) and exit facets of low reflectivity (LR) $R_1$ and $R_2$, respectively. Laser sources 32 and 34 have a fairly narrow bandwidth of operation and operate at different peak wavelengths $\lambda_1$ and $\lambda_2$ based upon the peak wavelengths of their respective gratings 44, 45. The peak wavelength operations can be accomplished in many different ways, such as by utilizing different material parameters in the laser sources, such as changes in the laser quantum well structure as is known in the art. Another way is by wavelength tuning such as utilizing a DBR or DFB laser diode structure or by utilizing an adjustable external grating coupled to a transmissive rear facet of the laser source, both of which are known in the art. In any case, the reflectivity bandwidth of respective gratings 44 and 45, which overlap to some extent the gain bandwidth of the lasers sources, are formed in output fiber 42, which output fiber is coupled to receive the combined wavelength output, $\lambda_P$, from WDM combiner 40. The operational wavelengths of the laser sources 32, 34 lie within 10 nm of the reflectivity band of their respective fiber gratings 44, 45. The combined output, $\lambda_P$, is WDM combined with signal, $\lambda_S$, on optical fiber 46 via WDM combiner 48 for launching into a fiber amplifier 49, such as, for example, a single mode $Er^{3+}$ core doped amplifier or $Yb^{3+}$ core doped double clad amplifier. Sources 32, 34 may have respective wavelength outputs, for example, $\lambda_1$=976 nm and $\lambda_2$=981 nm, which are combined via WDM multiplexor/demultiplexor 40 comprising a fused conical coupler. WDM device 40 combines wavelengths $\lambda_1$, and $\lambda_2$ or a small band of wavelengths surrounding $\lambda_1$ and $\lambda_2$ in the forward direction 41 of the coupler, and discriminates feedback reflectivity from respective gratings 44 and 46 and demultiplexes wavelengths $\lambda_1$ and $\lambda_2$ or an associated wavelength band surrounding these wavelengths in the rearward direction 43 for feedback into the optical cavities of respective laser sources 32, 34.

As indicated, the different wavelength outputs on fibers 32 and 34 are combined by WDM device 40 and launched into fiber 42 which includes fiber gratings 44 and 46 having respective peak reflectivities at $\lambda_1$ and $\lambda_2$ with a bandwidth of reflected wavelengths within the gain bandwidth of laser sources 32 and 34 or at least overlaps the gain bandwidths of laser sources 32 and 34. The peak reflectivity levels $R_1$ and $R_2$ of the exit facets of laser sources 32 and 34 are approximately equal to or greater than the peak reflectivity levels $R_{G1}$ and $R_{G2}$ of gratings 44 and 46. Gratings 44, 46 are preferably positioned from the output facets of laser sources 32 and 34 by an optical separation that exceeds the coherence length of laser sources 32 and 34. This separation is typically from about half a meter to several meters. The reflection bandwidth of grating is typically about 0.2 nm to about 1 nm but may be extended to as much as about 2 nm in this embodiment. However, the percent reflectivity of the exit facets of sources 32 and 34 must be approximately equal to or exceed the percent reflectivity of fiber gratings 44, 46 and the percent reflectivity of fiber gratings 44, 46 must exceed that of extraneous feedback reflectivity from a coupled applied application as well as from other optical components of the apparatus. As an example, the peak reflectivity $R_1$ and $R_2$ may be around 3% whereas the peak reflectivity levels $R_{G1}$ and $R_{G2}$ of fiber gratings 44, 46 may be around 1%, as given by the effective reflectivity, $R_{eff}$, formula previously discussed.

Reference is now made to another embodiment of this invention illustrated in FIG. 5 of apparatus 50 comprising semiconductor laser sources 52, 54 having beam outputs of distinguishable optical characteristics in the form of different peak operational wavelengths. The embodiment of FIG. 5 differs from FIG. 4 primarily in the placement of feedback gratings for establishing the coherence collapse regime operation of laser sources 53, 54. In FIG. 4, the fiber gratings 44, 46 are both positioned in the output fiber 42 after WDM combining of the laser source beams whereas, in FIG. 5, the fiber gratings 62, 64 are respectively positioned in the exit facet fibers 56, 58. Apparatus 50 includes semiconductor laser sources 52, 53 having different wavelength outputs, $\lambda_1$ and $\lambda_2$, coupled respectively to exit facet fibers 56, 58 that have their ends coupled to WDM combiner 60. Fibers 56, 58 include gratings 62, 64 which have respective peak reflectivities at $\lambda_1$ and $\lambda_2$ with a bandwidth of reflected wavelengths such that the peak wavelengths $\lambda_1$ and $\lambda_2$ overlap the gain bandwidths of laser sources 52 and 54. As in the case of the previous embodiment, wavelengths $\lambda_1$ and $\lambda_2$ are combined as combined output, $\lambda_P$, via WDM combiner 60 providing for a scaled pump power on single output fiber 66. Fiber amplifier 68 receives the signal, $\lambda_S$, to be amplified via fiber 65 which is launched into amplifier 68 via WDM combiner 67 while combined pump output, $\lambda_P$, on fiber 66 is launched via WDM combiner 67 into fiber amplifier 68. As in the case of previous embodiments, fiber amplifier 68 may be, for example, a single mode rare earth doped amplifier or rear earth doped double clad amplifier.

The peak reflectivity levels $R_1$ and $R_2$ of the exit facets of laser sources 52 and 54 are approximately equal to or greater than the respective peak reflectivity levels $R_{G1}$ and $R_{G2}$ of gratings 62 and 64. However, the respective laser sources operate at different wavelengths, $\lambda_1$ and $\lambda_2$, within their respective gain bandwidths based upon the peak wavelengths of their respective gratings 62, 64. Gratings 62, 64 are preferably positioned from the output facets of laser sources 52 and 54 by an optical separation that exceeds the coherence length of laser sources 52 and 54. As indicated previous, this distance may be from one half a meter to several meters. Gratings 62, 64 respectively lock the semiconductor laser cavity output to the peak wavelength so that the external cavity operation of the laser sources 52, 54 collapse into multiple longitudinal modes within the reflection bandwidth of the fiber gratings. As a result, any mode hopping transitions between competing modes do not exist in the combined beam out so that intensity fluctuations are not present in the input to fiber amplifier 68.

Reference is now made to FIG. 6 which illustrates a further embodiment of this invention comprising apparatus 70 with multiple laser sources of the type illustrated in FIG. 5 except that, in the case of FIG. 6, an additional number of semiconductor laser sources are provided for additional scaling of power. Therefore, the FIG. 6 embodiment is substantially the same as the FIG. 5 embodiment except for the additional laser sources 74 and 75. In particular, apparatus 70 comprises four laser sources 72, 73, 74 and 75 with the light output of source pairs 72, 73 and 74, 75 coupled to respective exit facet fibers 76, 77 and 78, 79. Exit facet fibers 76–79 respectively include a fiber grating 80A, 80, 80C and 80D. Fiber gratings 80A, 80B, 80C and 80D respectively have peak wavelength reflectivities at $\lambda_1, \lambda_2$ and $\lambda_3, \lambda_4$ with a bandwidth of reflected wavelengths that at least overlaps the respective gain bandwidths of laser sources 72–75. The operational wavelengths of the laser sources 72–75 lie within 10 nm of the reflectivity band of their respective fiber gratings 80A–80D. Wavelength outputs $\lambda_1, \lambda_2$ on exit facet fibers 76 and 77 are combined via WDM combiner 82A and launched onto a second or intermediate optical fiber 84. In a similar fashion, outputs $\lambda_3, \lambda_4$ on exit facet fibers 78 and 79 are combined via WDM combiner 82B and launched onto a second or intermediate optical fiber 86. The WDM combined output $\lambda_1, \lambda_2$ on fiber 84 and the WDM combined output $\lambda_3, \lambda_4$ on fiber 86 are, in turn, further combined via WDM combiner 88 into a single scaled pump output beam, $\lambda_P$, on single output fiber 90. WDM combiner 88 may be, for example, a fused biconical coupler having peak transfer wavelengths of $\lambda_1, \lambda_2, \lambda_3,$ and $\lambda_4$ or provide a transmission bandpass of transmission peaks $\lambda_1, \lambda_2, \lambda_3,$ and $\lambda_4$ extended to about ±10% about the transmission peak. Output fiber 90 in this as well as in other embodiments may be a single mode fiber as so too the exit facet fibers and the intermediate fibers. The fiber cores may have a circular, elliptical, rectangular or square cross section as is known in the art so as to closely match the NA of the laser source output via appropriate collimating and focusing optics well documented in the art. Amplifier 96 receives the signal, $\lambda_S$, to be amplified via fiber 92 which is launched into amplifier 96 via WDM combiner 94 while combined pump output, $\lambda_P$, on fiber 90 is launched via WDM combiner 94 into amplifier 96. As in the case of previous embodiments, fiber amplifier 96 may be, for example, a single mode rear earth doped amplifier or rear earth doped double clad amplifier.

The peak reflectivity levels $R_1, R_2, R_3$ and $R_4$ of the exit facets of laser sources 72–75 are approximately equal to or greater than the respective peak reflectivity levels $R_{G1}, R_{G2}, R_{G3}$ and $R_{G4}$ of gratings 80A–80D. However, the respective laser sources operate at different wavelengths, $\lambda_1, \lambda_2, \lambda_3,$ and $\lambda_4$, within their respective gain bandwidths based upon the peak wavelengths of their respective gratings. Gratings 80A–80D are preferably positioned from the output facets of laser sources 72–75 by an optical separation that exceeds the coherence length of these laser sources. As indicated previously, this distance may be from one half a meter to several meters. Gratings 80A–80D respectively lock the semiconductor laser cavity outputs to the peak wavelength so that the external cavity operation of the laser sources 72–75 collapse into multiple longitudinal modes within a bandwidth established by the reflectivity band of the fiber gratings. As a result, any longitudinal mode hopping transitions between competing modes will not exist in the combined beam out so that intensity fluctuations are not present in the input to fiber amplifier 96.

The embodiment of FIG. 7 is a polarization field/wavelength hybrid apparatus 100 for providing scaled power through beam combining of laser source outputs having distinguishable optical characteristics both in polarization field and wavelength. Apparatus 100 comprises four semiconductor laser sources 102–105 divided into pairs 102, 103 and 104, 105 wherein the output of the pairs have the same operational wavelength but different polarization fields. For example, laser sources 102, 103 both have peak wavelength outputs of, $\lambda_1$, but different polarization fields, such as, $P_\parallel$ and $P_\perp$, in their respective outputs launched into their respective exit facet, polarization-maintaining output fibers 106A and 106B. On the other hand, laser sources 104, 105 both have peak wavelength outputs of, $\lambda_2$, but different polarization fields, such as, $P_\parallel$ and $P_\perp$, in their respective outputs launched into their respective exit facet, polarization-maintaining output fibers 107A and 107B. Polarization beam multiplexors (PBMs) 108A and 108B, such as of the types disclosed in connection with the discussion with respect to in the FIG. 1 embodiment, combined respective the orthogonally polarized beams on fibers 106A, 106B and 107A, 107B providing a combined output of the source pairs on respective fibers 109A and 109B.

Fibers 109A, 109B respectively contain fiber gratings 110 and 111 having respective peak wavelength reflectivities $R_{G1}$ and $R_{G2}$ at respective wavelengths $\lambda_1$ and $\lambda_2$. The peak reflectivity levels $R_1$ and $R_2$ of the exit facets of laser sources pairs 102, 103 and 104, 105 are greater than the respective peak reflectivity levels $R_{G1}$ and $R_{G2}$, of gratings 110, 111. However, the respective laser source pairs 102, 103 and 104, 105 operate at different wavelengths, $\lambda_1$ and $\lambda_2$ within their respective gain bandwidths based upon the peak wavelengths of their respective feedback gratings. Gratings 110, 111 are preferably positioned from the output facets of laser source pairs 102, 103 and 104, 105 by an optical separation that exceeds the coherence length of these laser sources. The output beams on fibers 109A and 109B of different wavelength are combined via WDM combiner 12 and provided as output on single output fiber 114 as scaled pump beam, $\lambda_P$. Amplifier 119 receives the signal, $\lambda_S$, to be amplified via fiber 116 which is launched into amplifier 119 via WDM combiner 118 while combined pump output, $\lambda_P$, on single output fiber 114 is launched via WDM combiner 118 into amplifier 119. As in the case of previous embodiments, fiber amplifier 119 may be, for example, a single mode rear earth doped amplifier or rear earth doped double clad amplifier.

As indicated in previous embodiments, gratings 109A and 109B respectively lock the semiconductor laser cavity outputs to the peak wavelength so that the external cavity operation of the laser sources 102–105 collapse into multiple longitudinal modes within a bandwidth established by the reflectivity wavelength band of fiber gratings 110, 111. As a result, any longitudinal mode hopping transitions between competing modes do not exist in the combined beam out so that intensity fluctuations are not present in the pump input to fiber amplifier 119.

An advantage of the FIG. 7 embodiment is the scaling of power of multiple laser sources through polarization combining while requiring only two fiber gratings, such as two or more polarization combined laser source output beams wavelength control by a single fiber grating. The single fiber grating for multiple laser sources with different polarization field outputs brings about coherence collapse in the operation of all of the sources by expanding their operation to multiple longitudinal mode operation eliminating the possibility of longitudinal mode selection or favoritism in any one of the laser sources and minimizing fluctuations in intensity in the finally combined beam output.

It should be understood by those skilled in the art that the operation of this invention has particular application to semiconductor laser sources that have a predetermined but narrow bandwidth of operation as compared to laser sources that have such a narrow linewidth operation that there is no tendency for longitudinal mode hopping in their cw operation. In cases where the laser source has a limited bandwidth of operation having the tendency to operate different longitudinal modes present in its output, then the operation of this invention to achieve coherence collapse becomes highly useful for preventing longitudinal mode hopping in single or multiple laser source output. Such a case of limiting bandwidth in laser source operation is usually less than the bandwidth of the fiber grating itself, which may be, for example, about 100 GHz. The fiber grating bandwidth only need be within a portion of the gain bandwidth of the laser source such as, for example, within 10 nm of the emission or peak wavelength of the laser source.

It will be appreciated by those skilled in the art that although the preferred embodiment of the invention has been described in detail for the purpose of clarity, certain changes or modifications may be practiced without departing from the scope of the invention. For example, it should be evident that the present invention provides a stabilized dual laser source of high-power optical radiation that is suitable for high power pumping of optical fiber amplifiers and fiber lasers. The invention will enable improvement in the operating characteristics of these pump devices for applied optical applications. Also, multiple lasers greater than two in number with different optical characteristics, e.g., spectral outputs of different polarization fields or different operational wavelengths, can be combined to form a high power output beam that operates in multiple longitudinal modes with reduced noise due to extraneous feedback, operation temperature changes or mode hopping, resulting in a final single output beam highly adaptable for pumping fiber amplifiers and fiber lasers. Thus, the invention, as described herein, is intended to embrace all such alternatives, variations and modifications as may fall within the spirit and scope of the following claims.

What is claimed is:

1. Apparatus for stabilizing multiple laser sources comprising:

a plurality of semiconductor laser sources having respective lasing cavities capable of lasing within a narrow bandwidth of wavelengths and providing spectral beam outputs at their respective laser exit facets having distinguishable optical characteristics from one another;

optical transfer means for coupling the spectral beam outputs from said laser sources via said laser exit facets;

means coupled to receive said optical transfer means to combine said spectral beam outputs into a single beam onto an output optical fiber;

at least one fiber grating formed in said apparatus, said at least one fiber grating having a reflectivity band for reflecting back from either said spectral beam outputs or said single beam to at least one of said laser sources a small portion of selected wavelengths within a gain bandwidth of said at least one of laser sources;

said at least one fiber grating having a reflectivity level approximately equal to or less than the reflectivity level of the exit facet said at least one of said laser sources;

said at least one fiber grating positioned to have an optical separation from said at least one of said laser sources that is approximately equal to or longer than a coherence length of at least one of said laser sources to cause the same to operate in multiple longitudinal modes broadening the spectral output thereof by several orders of magnitude.

2. The apparatus of claim 1 wherein said distinguishable optical characteristics are different polarization fields in the respective spectral beam outputs.

3. The apparatus of claim 2 wherein said combining means comprises a polarizing beam combiner.

4. The apparatus of claim 3 wherein said at least one fiber grating is formed in said output optical fiber.

5. The apparatus of claim 2 wherein said output optical fiber has a constant longitudinal birefringence that maintains the state of polarization of said combined spectral beam outputs launched into said output optical fiber.

6. The apparatus of claim 4 wherein said output optical fiber is a Panda™ fiber.

7. The apparatus of claim 1 wherein said distinguishable optical characteristics are different operational wavelengths.

8. The apparatus of claim 7 wherein said combining means comprises a WDM beam combiner.

9. The apparatus of claim 7 wherein said combining means comprises a wavelength division multiplexor/demultiplexor.

10. The apparatus of claim 9 wherein there are multiple fiber gratings formed in said output optical fiber, one for each of said semiconductor laser sources.

11. The apparatus of claim 9 wherein said optical transfer means comprise an optical fiber, one for each of said semiconductor laser sources and coupled to receive the spectral beam output via its laser exit facet.

12. The apparatus of claim 9 wherein said wavelength division multiplexor/demultiplexor is a fused biconical coupler.

13. Apparatus for stabilizing multiple laser sources comprising:

a plurality of semiconductor laser sources having respective lasing cavities capable of lasing within a narrow bandwidth of wavelengths and providing spectral beam outputs at their respective laser exit facets having different distinguishable optical characteristics from one another;

an optical fiber coupled to each of said exit facets to receive a respective spectral beam output;

means coupled to said facet coupled optical fibers to combine said spectral beam outputs into a single beam onto an output optical fiber;

fiber gratings formed in one or more of said optical fibers, said fiber gratings having a reflectivity band for reflecting back into said laser cavities via said combining means a small portion of selected wavelengths of said single beam within a gain bandwidth of said laser sources while the remaining portion of said single beam is transmitted through said fiber gratings;

said fiber gratings having a reflectivity level approximately equal to or less than the reflectivity level of said laser exit facets;

said fiber gratings positioned in said one or more of said optical fibers to have an optical separation from said semiconductor laser sources that is approximately equal to or longer than a coherence length of said laser sources to cause said laser sources to operate in multiple longitudinal modes broadening the spectral output of said laser sources by several orders of magnitude.

14. The apparatus of claim 13 wherein said different distinguishable optical characteristics are different operational wavelengths comprising the respective spectral beam outputs.

15. The apparatus of claim 14 wherein said combining means comprises a WDM combiner.

16. The apparatus of claim 13 wherein a reflectivity band of said fiber gratings lie within the gain bandwidth of said laser sources.

17. The apparatus of claim 16 wherein said reflectivity band is from about 0.2 nm to about 1 nm.

18. The apparatus of claim 13 wherein said output optical fiber is coupled to pump a fiber amplifier or fiber laser.

19. The apparatus of claim 13 wherein said different distinguishable optical characteristics are operational wavelengths of said laser sources, the operational wavelength of said lasers sources lying approximate of the reflectivity band of said optical fiber gratings.

20. The apparatus of claim 19 wherein the operational wavelength of said lasers sources lie within 10 nm of the reflectivity band of said optical fiber grating.

21. The apparatus of claim 13 wherein there are a plurality of fiber gratings in said output optical fiber, one respectively for each of said laser sources, said fiber gratings having a respective reflectivity band for reflecting light back in said output optical fiber via said combining means comprising a small portion of a selected wavelength band within a gain bandwidth of the respective laser sources;

said fiber gratings respectively having a reflectivity level approximately equal to or less than the reflectivity level of said laser exit facets;

said fiber gratings positioned in said output optical fiber to have an optical separation from said semiconductor laser sources that is approximately equal to or longer than a coherence length of said laser sources to cause said laser sources to operate in multiple longitudinal modes broadening the spectral output of said laser sources by several orders of magnitude.

22. The apparatus of claim 21 wherein the respective operational wavelengths of said lasers sources lying approximate of the reflectivity band of their respective fiber gratings.

23. The apparatus of claim 22 wherein the operational wavelengths of said laser sources lie within 10 nm of the reflectivity band of their respective fiber gratings.

24. The apparatus of claim 23 wherein the reflectivity band of the respective fiber gratings is from about 0.2 nm to about 1 nm.

25. The apparatus of claim 21 wherein said fiber gratings have an effective reflectivity, $R_{eff}$, defined as $R_{eff} = \eta^2 R_g$ where $R_g$ is peak reflectivity of said gratings and $\eta$ is the coupling efficiency of spectral beam outputs from said laser sources to said facet coupled optical fibers.

26. The apparatus of claim 21 wherein the reflectivity level of said fiber gratings is at least 3 times less than the reflectivity level of said exit facets.

27. The apparatus of claim 13 wherein there is a respective fiber grating in each of said exit facet fibers, one respectively for each of said laser sources, said fiber gratings having a respective reflectivity band for reflecting light back in said exit facet fibers comprising a small portion of a selected wavelength band within a gain bandwidth of the respective laser sources;

said fiber gratings respectively having a reflectivity level approximately equal to or less than the reflectivity level of its respective laser exit facet;

said fiber gratings positioned in said exit facet fibers to have an optical separation from their respective semiconductor laser sources that is approximately equal to or longer than a coherence length of said laser sources to cause said laser sources to operate in multiple longitudinal modes broadening the spectral output of said laser sources by several orders of magnitude.

28. The apparatus of claim 27 wherein the respective operational wavelengths of said lasers sources lying approximate of the reflectivity band of their respective optical fiber gratings.

29. The apparatus of claim 28 wherein the operational wavelengths of said laser sources lie within 10 nm of the reflectivity band of their respective fiber gratings.

30. The apparatus of claim 29 wherein the reflectivity band of the respective fiber gratings is from about 0.2 nm to about 1 nm.

31. The apparatus of claim 27 wherein said fiber gratings have an effective reflectivity, $R_{eff}$, defined as $R_{eff} = \eta^2 R_g$ where $R_g$ is peak reflectivity of said gratings and $\eta$ is the coupling efficiency of spectral beam outputs from said laser sources to said output optical fiber.

32. The apparatus of claim 27 wherein the reflectivity level of said fiber gratings is at least 3 times less than the reflectivity level of said exit facets.

* * * * *